United States Patent
Acena et al.

(10) Patent No.: US 9,333,864 B2
(45) Date of Patent: May 10, 2016

(54) WAKE-BY-CONTROL PILOT CIRCUIT FOR ONBOARD BATTERY CHARGER

(71) Applicant: Lear Corporation, Southfield, MI (US)

(72) Inventors: Miguel Angel Acena, Vallis (ES); Youssef Ghabbour, Vallis (ES)

(73) Assignee: Lear Corporation, Southfield, MI (US)

( * ) Notice: Subject to any disclaimer, the term of this patent is extended or adjusted under 35 U.S.C. 154(b) by 532 days.

(21) Appl. No.: 13/795,781

(22) Filed: Mar. 12, 2013

(65) Prior Publication Data

US 2013/0320922 A1   Dec. 5, 2013

Related U.S. Application Data

(60) Provisional application No. 61/653,541, filed on May 31, 2012.

(51) Int. Cl.
*B60L 11/18* (2006.01)

(52) U.S. Cl.
CPC ......... *B60L 11/1811* (2013.01); *B60L 11/1838* (2013.01); *Y02T 10/7005* (2013.01); *Y02T 10/7072* (2013.01); *Y02T 10/92* (2013.01); *Y02T 90/121* (2013.01); *Y02T 90/128* (2013.01); *Y02T 90/14* (2013.01); *Y02T 90/163* (2013.01)

(58) Field of Classification Search
CPC .................................................. B60L 11/1811
USPC ......................................................... 320/109
See application file for complete search history.

(56) References Cited

U.S. PATENT DOCUMENTS

| | | | |
|---|---|---|---|
| 7,688,024 B2 | 3/2010 | Kamaga | |
| 8,179,086 B2 | 5/2012 | Nakaso et al. | |
| 8,301,322 B2 * | 10/2012 | Mitsutani | B60K 6/445 180/65.21 |
| 8,774,997 B2 | 7/2014 | Ichikawa et al. | |
| 8,779,720 B2 | 7/2014 | Gaul et al. | |
| 2002/0172062 A1 * | 11/2002 | Furukawa | B60L 11/1803 363/132 |
| 2010/0213896 A1 | 8/2010 | Ishii et al. | |
| 2010/0295507 A1 | 11/2010 | Ishii et al. | |
| 2010/0299008 A1 * | 11/2010 | Mitsutani | B60K 6/445 701/22 |
| 2012/0032634 A1 | 2/2012 | Cavanaugh | |
| 2012/0098490 A1 | 4/2012 | Masuda | |
| 2012/0139489 A1 * | 6/2012 | Gaul | B60L 11/1816 320/109 |
| 2013/0038283 A1 * | 2/2013 | Acena | B60L 11/1838 320/109 |
| 2013/0175988 A1 * | 7/2013 | Ghabbour | B60L 11/1816 320/109 |

(Continued)

FOREIGN PATENT DOCUMENTS

| | | |
|---|---|---|
| CN | 201345044 Y | 11/2009 |
| DE | 102009017089 A1 | 10/2010 |

*Primary Examiner* — Richard Isla Rodas
*Assistant Examiner* — Dung V Bui
(74) *Attorney, Agent, or Firm* — Brooks Kushman P.C.

(57) ABSTRACT

An on-board battery charging system for a plug-in electric vehicle has a charging unit for charging a high-voltage battery and a controller for controlling and managing current flow used to support charging related operations for the high-voltage battery. The controller may detect a connection between the on-board battery charging system and electric vehicle supply equipment (EVSE) and is configured to enter a sleep mode when a control pilot signal from the EVSE is either absent or indicative of a delayed charge mode. The charging system may include a wake-by-control pilot circuit operable to wake the controller from the sleep mode when the control pilot signal is detected and when the control pilot signal transitions from a non-zero static DC voltage to an active PWM signal.

19 Claims, 5 Drawing Sheets

(56) References Cited

U.S. PATENT DOCUMENTS

2013/0320920 A1* 12/2013 Jefferies ............. G08B 13/1418
320/109

2013/0320922 A1* 12/2013 Acena ................. B60L 11/1811
320/109

* cited by examiner

WAKE-BY-CONTROL PILOT CIRCUIT FOR ONBOARD BATTERY CHARGER

CROSS-REFERENCE TO RELATED APPLICATIONS

This application claims the benefit of U.S. Provisional Application No. 61/653,541, filed May 31, 2012, the disclosure of which is incorporated in its entirety by reference herein.

TECHNICAL FIELD

The present application relates to a wake-up circuit of the type suitable for use with on-board vehicle battery chargers to awake vehicles from sleep mode when connected to a cordset, charging station, or other element used to facilitate vehicle charging.

BACKGROUND

An on-board vehicle charger may be used to charge a high voltage battery found in a hybrid electric or electric vehicle to provide energy to an electrically powered motor. In some cases, the charging may be facilitated with a cordset or other element having capabilities to facilitate current delivery to the on-board charger, such as from a wall charger or other type of charging station. The cordset may include an adaptor to facilitate attachment to an outlet or other receptacle associated with the on-board charger. The on-board charger may include electronics or other elements to control and manage current flow to the high voltage battery and other the related charging operations.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
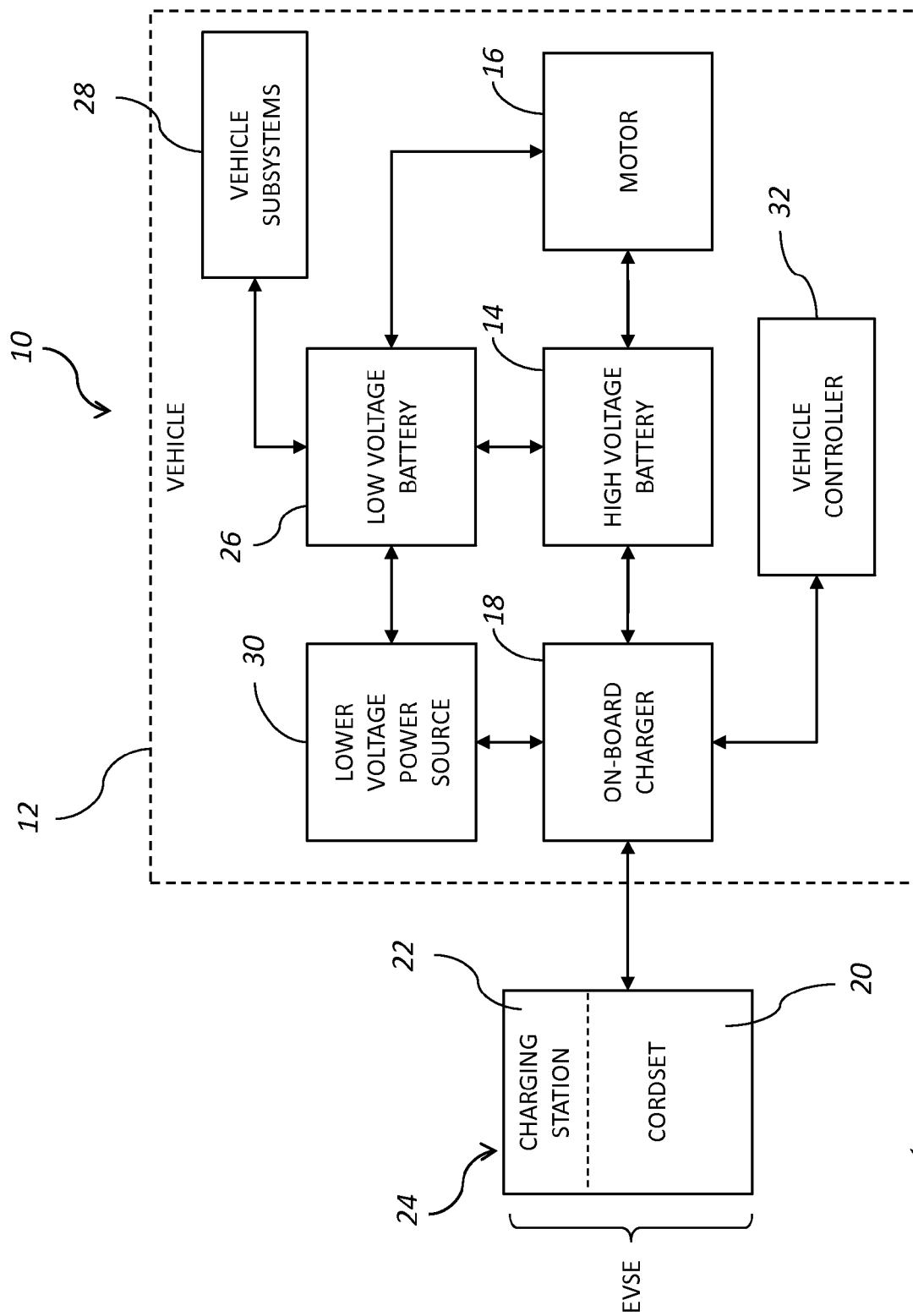
FIG. 1 is a simplified, exemplary functional block diagram illustrating a vehicle power system in accordance with one or more embodiments of the present application.

FIG. 1 functionally illustrates logical elements associated with a vehicle power system 10 in accordance with one or more embodiments of the present application. The vehicle power system 10 is shown and predominately described for use within an electric vehicle, hybrid electric vehicle, or other vehicle 12 having a high voltage battery 14 or other energy source operable to provide current sufficient for use by an electric motor 16 to propel the vehicle 12. The vehicle 12 may include an on-board charger (OBC) 18 to facilitate charging the high voltage battery 14 with current delivered through a cordset 20 used to connect the OBC to an external power supply, such as a wall charger or other charging station 22. The cordset 20 may be used to deliver current through a cable having a terminal (not shown) at one end adapted for receipt within a receptacle or charge port (not shown) associated with the OBC 18. The cordset 20, charging station 22, and any additional elements installed for the purpose of delivering energy from an electrical utility power grid (not shown) to the vehicle 12 may be collectively referred to herein as electric vehicle supply equipment (EVSE) 24.

The OBC 18 may include electronics or other elements operable to control and manage current flow used to support charging related operations for the high voltage battery 14, and optionally, to support charging or otherwise powering a low voltage battery 26, one or more vehicle subsystems 28, and/or other electronically operable elements included within the vehicle 12. The low voltage battery 26 may be included to support powering vehicle subsystems 28 that operate at voltages lower than the electric motor 16, such as but not limited to remote keyless entry systems, heating and cooling systems, infotainment systems, braking systems, etc. In addition to being charged with energy provided through the cordset 20, one or more of the high and low voltage batteries 14, 26 and vehicle subsystems 28 may be operable to power each other and/or to be powered with energy generated by the electric motor 16.

The low voltage battery 26, for example, may be operable to provide current sufficient for use by a lower voltage power source 30. The lower voltage power source 30 may be operable to regulate current from the low voltage battery 26 for use with one or more of the vehicle subsystems 28 and/or the OBC 18. A vehicle controller 32 may be included to facilitate executing logical operations and undertaking other processing requirements associated with the vehicle 12. Optionally, one or more of the elements may include their own controller or processor. For exemplary purposes, the terms "lower," "low" and "high" are used to differentiate voltage levels respectively coinciding with approximately 5 VDC, 12 VDC, and 200 VDC, which are commonly used within vehicles to support the operation associated with each of the corresponding energy sources. This is done without intending to unnecessarily limit the scope of the present application as the present application fully contemplates energy sources having the same or different voltage levels and/or current production/generation capabilities. For instance, the "high" voltage level in most European regions typically coincides with approximately 400 VDC.

According to one or more embodiments of the present application, the lower voltage power source 30 may be operable to set a voltage used by the OBC 18 to test for connection of the cordset 20, generate a wake-up signal, or the like. The lower voltage power source 30, for example, may be a voltage or current regulator having capabilities sufficient to compensate for voltage variation of the low and/or high voltage battery 14, 26 in order to provide steady current to the OBC 18 and/or other elements electrically connected thereto, which may be sensitive to voltage variations. In this manner, although depicted as a separate element in the functional block diagram illustrated in FIG. 1, the lower voltage power source 30 may be contained within the OBC 18 as an electrical element thereof.

Figure 2:
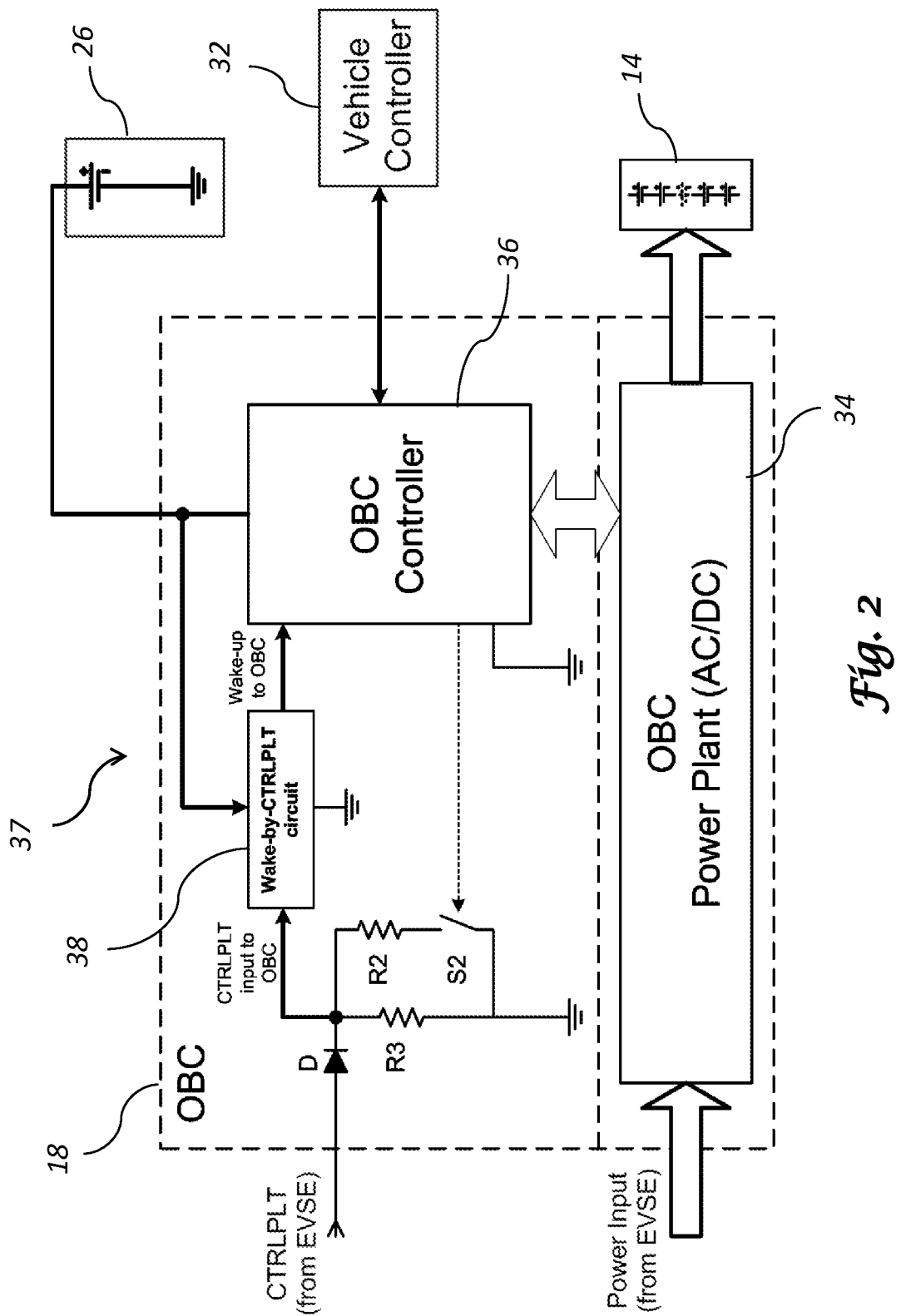
FIG. 2 is a simplified, exemplary schematic diagram illustrating an on-board vehicle charger in accordance with one or more embodiments of the present application.

FIG. 2 illustrates the OBC 18 in greater detail. As shown, the OBC 18 may include a charging unit (e.g., an OBC power plant) 34 for converting alternating current (AC) from the EVSE 24 to direct current (DC) required to charge the high voltage battery 14. Accordingly, the charging unit 34 may include an AC-to-DC power converter and other associated power electronics operable to convert energy supplied by the electrical grid into a usable form for charging the high voltage battery 14. For instance, the charging unit 34 may include power electronics to boost the power factor to meet regulatory standards or provide DC-to-DC power conversion for matching charging profiles of the high voltage battery 14.

The OBC 18 may also include an OBC controller 36 operable to handle control algorithms for the OBC functions described above. For instance, the OBC controller 36 may enable charging in accordance with regulatory standards. Further, the OBC controller 36 may detect the connection of the cordset 20 to the charging port, identify the charging cable and/or plug, and control and monitor switching devices or other electronics associated with the OBC 18, such as current and voltage sensing devices. The OBC controller 36 may also communicate with the vehicle controller 32 to convey charging status and other relevant information corresponding to the operation of the OBC 18. Although depicted as an integrated controller, the OBC controller 36 may be provided as a separate component electrically connected to the OBC 18 without departing from the scope of the present application. Indeed, the OBC's charging unit 34 and the OBC controller 36 and associated control electronics, whether integrated with the OBC 18 or not, may form an on-board battery charging system 37, in accordance with one or more embodiments of the present application.

In addition to providing energy from the electrical power grid, the EVSE 24 also generates a control pilot (CTRLPLT) signal, which may be read and acknowledged by the OBC 18. The CTRLPLT signal can convey information to the OBC controller 36 for use in launching and monitoring the battery charging process. Among its main functions, the CTRLPLT signal can be used to check the continuity of the vehicle chassis connection to the power earth of the EVSE 24. If this signal is not present at the OBC input, the charging process may not be allowed. The CTRLPLT signal may also include a command from the EVSE 24 to the OBC 18 indicating the maximum current that the OBC 18 can draw from the electrical grid to charge the high voltage battery 14. This command may be embedded in the duty cycle of the CTRLPLT signal, which can be converted into available amps from the electrical grid according to predefined criteria, such as certain formulae defined in the relevant regulatory standards. To this end, the CTRLPLT signal may be generated using pulse width modulation (PWM). The CTRLPLT signal may also provide an answer from the vehicle 12 to the EVSE 24 informing it that the vehicle 12 is ready to accept charge. Thereafter, the charging process may commence.

Figure 3:
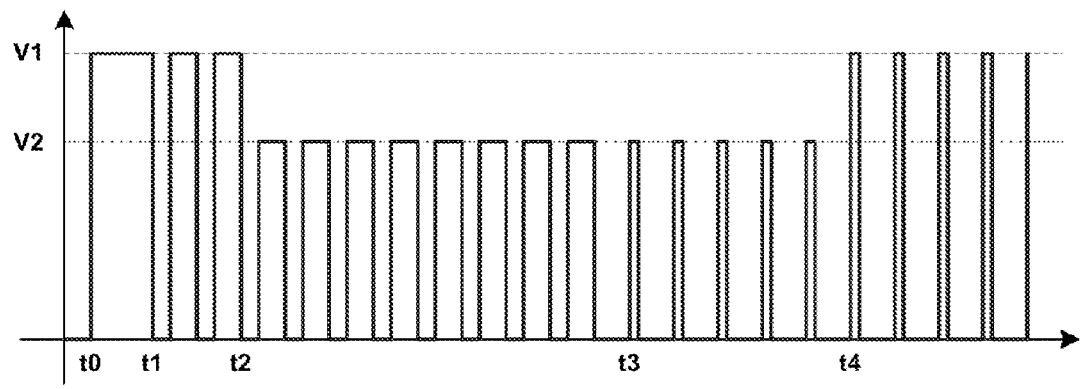
FIG. 3 is an exemplary timing diagram of a control pilot (CTRLPLT) signal generated by a charging station in accordance with one or more embodiments of the present application.

FIG. 3 depicts a simplified, exemplary timing diagram of a CTRLPLT input signal to the OBC 18. The EVSE 24 typically generates the CTRLPLT signal as bipolar. The CTRLPLT signal may then be rectified at the input to the OBC 18 so that it becomes unipolar, as illustrated in FIG. 3. At time t0, the EVSE 24 is connected to the vehicle 12. The OBC 18 may detect the CTRLPLT signal as a static DC signal with amplitude V1. At time t1, the OBC 18 may detect the CTRLPLT signal PWM generated with a duty cycle D equal to $D_1$ (%) indicating that $I_1$ (Amps RMS) are available from the electrical grid. At time t2, the OBC 18 may be ready to accept current for charging the high voltage battery 14. To this end, the OBC controller 36 may be operable to close switch S2. Accordingly, the amplitude of the CTRLPLT signal changes from V1 (e.g., approx. 9V) to V2 (e.g., approx. 6V). At time t3, the duty cycle D of the PWM generated CTRLPLT signal changes to a value $D_2$ (%) indicating to the OBC 18 that $I_2$ (Amps RMS) are available from the electrical grid. When the OBC 18 is no longer ready to accept charge from the electrical grid or the charging process has been completed, switch S2 may be opened. As a result, the amplitude of the CTRLPLT signal may change from V2 back to V1, as shown at time t4.

In addition to providing the forgoing information, the CTRLPLT signal may also be used to perform additional functions, such as awaking the vehicle 12 from a sleep mode (or low quiescent current mode). In a conventional vehicle, the sleep mode helps maintain the health of the low voltage battery (e.g., the 12V battery), which powers the vehicle's subsystems. If the vehicle is not running, the low voltage battery is not receiving charge from an alternator and the vehicle's electrical system can deplete it completely. To cope with this problem, when the vehicle is parked during long periods, it may be placed into a low current-consumption mode, often referred to as the sleep mode. When the user is about to open or drive the vehicle, specific input signals are used to awake the vehicle and exit the sleep mode. Some examples of signals used to trigger the wake-up event include keyless entry, door-open, or anti-theft alarm input signals.

In a plug-in electric vehicle, such as vehicle 12, a wake-up event is needed when the vehicle 12 is parked and a user plugs the EVSE 24 to the vehicle to recharge its high voltage battery 14. According to one or more embodiments, the CTRLPLT signal may be used to trigger the wake-up event. With it, the whole vehicle may awake from a sleep mode, enter into a charging mode, and begin charging the high voltage battery 14. During or after the charging process, multiple conditions or scenarios can make the vehicle 12 return temporarily or permanently to the sleep mode by means of the typical CTRLPLT activity, examples of which are described below:

Scenario A: After the high voltage battery 14 is completely recharged, the OBC 18 may communicate to the EVSE 24 that no more charge will be accepted and then place the vehicle 12 into the sleep mode. The EVSE 24 may continue generating the CTRLPLT signal until the cordset 20 is disconnected from the vehicle 12.

Scenario B: If, during the charging process, there is an electrical grid outage, then the CTRLPLT signal becomes zero and the charging process is stopped. The OBC 18 may wait for a predetermined period of time to see if the CTRLPLT signal returns. If the CTRLPLT signal does not return within the predetermined period, the OBC 18 may place the vehicle 12 into the sleep mode. Thereafter, when the electrical grid comes back into operation, the CTRLPLT signal may reappear and the charging cycle may restart as described in Scenario A.

Figure 4A:
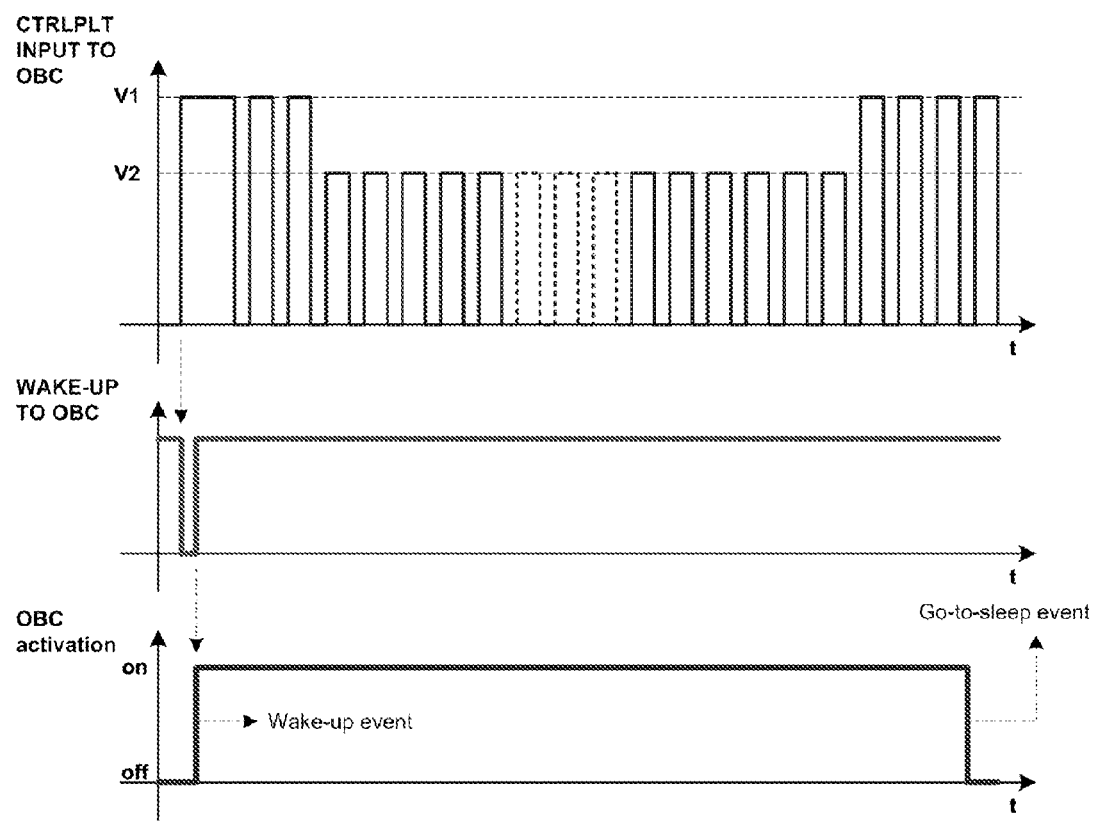
FIGS. 4a-c are exemplary timing diagrams of a CTRLPLT signal and a Wake-by-CTRLPLT signal in accordance with one or more embodiments of the present application.
Figure 4B:
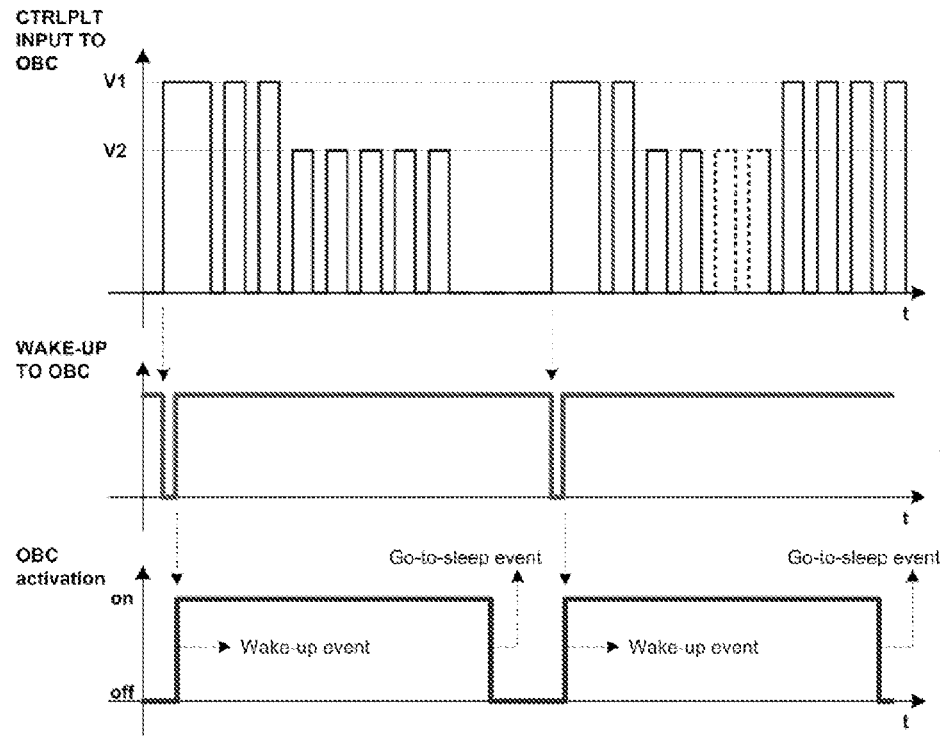

FIGS. 4a and 4b depict exemplary timing diagrams illustrating the behavior of both the CTRLPLT signal and a Wake-by-CTRLPLT signal (i.e., a WAKE-UP signal to the OBC) needed by the OBC controller 36 to awake it and the vehicle 12 from the sleep mode in accordance with Scenarios A and B, respectively. For instance, FIG. 4a depicts a CTRLPLT signal, a WAKE-UP to OBC signal, and corresponding OBC activation for a typical charge cycle described above in Scenario A. FIG. 4b depicts a CTRLPLT signal, a WAKE-UP to OBC signal, and corresponding OBC activation for a charge cycle interrupted and restarted, as described above in Scenario B. The WAKE-UP to OBC signal generated from the CTRLPLT signal is shown with negative logic for illustrative purposes. However, it may also be generated with positive logic depending on particular OBC implementations without departing from the scope of the present application. Typically, OBCs need only a rising or falling edge at its Wake-by-CTRLPLT input.

Figure 4C:
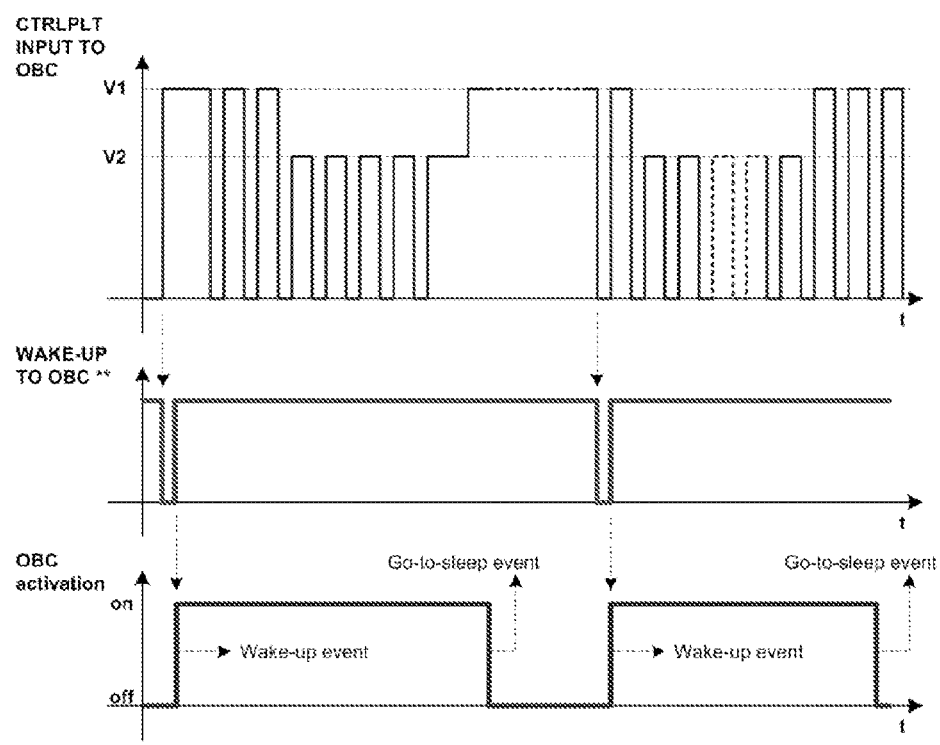

Charging stations for plug-in electric vehicles with multiple docks and EVSEs that provide battery charging services for several vehicles create new use cases apart from the exemplary ones described above with respect to Scenario A and Scenario B. One such case is the so-called "delayed charge mode," described below as Scenario C. FIG. 4c illustrates an exemplary timing diagram depicting the signal and intended OBC behavior during the delayed charge mode.

Scenario C: The EVSE 24 may start generating the CTRLPLT signal to the OBC and, at some moment, the EVSE stops the charging process temporarily by setting the CTRLPLT signal to permanent high (e.g., constant V1 seen at the input of the OBC). The EVSE 24 may stop the charging process, for example, due to lower electrical grid capacity available or any other suitable reason. Consequently, the OBC 18 may wait for a predetermined period of time to verify that the delayed charge mode has been requested and goes into the sleep mode together with the rest of the vehicle 12. Only when the CTRPLT signal returns as a PWM signal does the OBC awake and the battery charging process resume.

During the sleep mode, a circuit that generates the WAKE-UP to OBC pulses needs to remain active and waiting for valid wake-up events derived from the behavior of the CTRLPLT signal (e.g., as described in Scenarios A, B or C, or any other combination thereof). Accordingly, such a circuit should be designed as ultra-low power, such that its own power consumption from the low voltage battery is either negligible or acceptable by the vehicle designer. Previous circuit solutions for generating the WAKE-UP to OBC pulses are sub-optimal because they cannot handle Scenario C (i.e., they are unable to wake-up again when CTRLPLT is set to high) without additional hardware or software resources, or they draw excessive sleep current, or both.

Referring back to FIG. 2, a Wake-by-CTRLPLT circuit 38 according to one or more embodiments of the present application is functionally depicted between the CTRLPLT input to the OBC and the OBC controller 36. As shown, the Wake-by-CTRLPLT circuit 38 may be permanently connected to the low voltage battery 26 and may generate the wake-up signal pulses (i.e., the WAKE-UP to OBC signal) to the OBC controller 36 to make it exit from the sleep mode according to Scenarios A, B or C, or any combination thereof.

Figure 5:
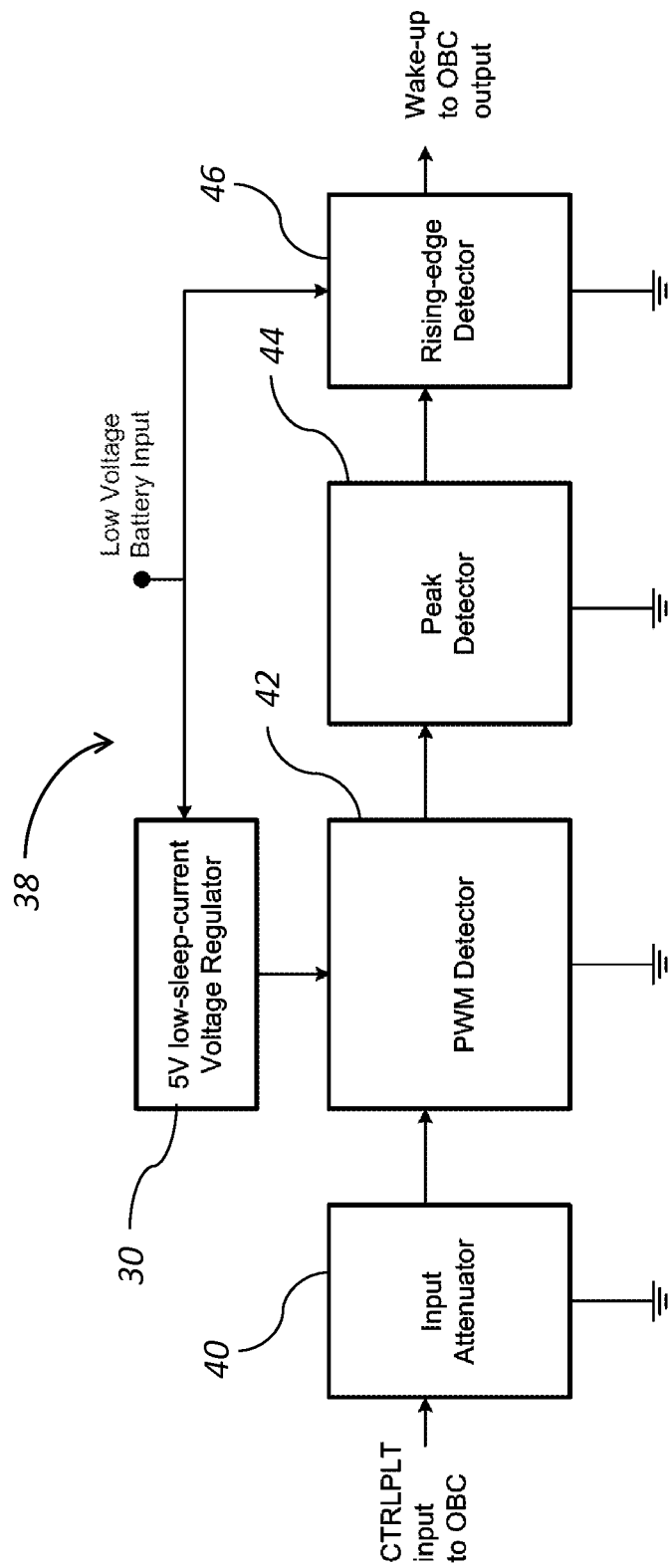
FIG. 5 is a simplified, exemplary block diagram of a wake-by-CTRLPLT circuit in accordance with one or more embodiments of the present application.

FIG. 5 is a simplified, exemplary block diagram of the Wake-by-CTRLPLT circuit 38 according to one or more embodiments of the present application. As shown, the Wake-by-CTRLPLT circuit 38 may include several sub-circuits. For instance, the Wake-by-CTRLPLT circuit 38 may include an input attenuator 40, a PWM detector 42, a peak detector 44, and/or an edge detector 46. The input attenuator 40 may adapt the voltage levels at the input of the circuit (e.g., typically 9V maximum) to lower maximum levels needed by the following block or blocks (e.g., typically 5V maximum).

The PWM detector 42 may produce output pulses only when the CTRLPLT input is a PWM signal. If the CTRLPLT input signal is a static DC voltage (e.g., either 0V or 5V), then the PWM detector output may be zero. The PWM detector 42 can help to separate an active phase from a passive one along the charging process when monitoring the CTRLPLT signal. According to one or more embodiments of the present application, the PWM detector block 42 may be synthesized internally with a logic circuit whose inputs are the CTRLPLT signal and a delayed version of the CTRLPLT signal. For instance, the logic circuit may include an exclusive-OR (XOR) gate.

The peak detector 44 may receive the maximum of the PWM detector output when it produces repetitive pulses. In doing so, the peak detector 44 may remove the high-frequency content of the PWM detector output such that the resulting signal from the peak detector is either 0V or 5V DC corresponding to the absence or presence of a valid PWM signal in the CTRLPLT input. The rising edge detector 46 may produce resulting wake-up pulses only upon a transition from 0V to 5V at the output of the peak detector 44 (i.e., a new PWM active session begins in the CTRLPLT signal).

The Wake-by-CTRLPLT circuit 38 may also include the lower voltage power source 30. As shown in FIG. 5, the lower voltage power source 30 may be a lower voltage regulator, such as a 5V voltage regulator, having low sleep current characteristics. The lower voltage power source 30 may be a dedicated power supply for the PWM detector 42. Moreover, the lower voltage power source 30 may always be active (i.e., on during both sleep and wake-up modes). Consequently, the lower voltage power source 30 may be an ultra-low sleep current device. Otherwise, its current consumption may excessively negatively impact the overall vehicle sleep current consumption in sleep mode. The PWM detector 42 may likewise be a low sleep current device because it may also be active during the sleep mode.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An on-board battery charging system for a vehicle comprising:
    a charging unit including a power converter operable to convert energy supplied by an external power supply into a usable form for charging a high-voltage battery during a battery charging operation;
    a controller in communication with the charging unit for monitoring and controlling the battery charging operation, the controller being further operable to detect a connection to the external power supply; and
    a wake-by-control pilot circuit powered by a low-voltage power source and connected to an input side of the controller, the wake-by-control pilot circuit having an input for receiving a control pilot signal and outputting a wake-up signal pulse to wake the controller from a sleep mode at least when the external power supply exits a delayed charge mode;
    wherein the wake-by-control pilot circuit includes a pulse width modulation (PWM) detector that outputs signal pulses when the control pilot signal is pulse width modulated.

2. The system of claim 1, wherein the control pilot signal indicates a valid connection to the external power supply and a maximum current that can be drawn from an electrical power utility grid.

3. The system of claim 1, wherein the wake-by-control pilot circuit generates the wake-up signal pulse when the control pilot signal transitions from a non-zero static DC voltage to an active PWM signal.

4. The system of claim 3, wherein the wake-by-control pilot circuit further generates the wake-up signal pulse upon an initial detection of the control pilot signal.

5. The system of claim 1, wherein the PWM detector includes a logic circuit having a first input for receiving the control pilot signal and a second input for receiving a delayed control pilot signal.

6. The system of claim 5, wherein the logic circuit is an exclusive-OR gate.

7. The system of claim 1, wherein an output from the PWM detector is zero when the control pilot signal is a static DC voltage.

8. The system of claim 1, wherein the wake-by-control pilot circuit includes a peak detector operable to output a lower-voltage DC signal when the PWM detector outputs signal pulses.

9. The system of claim 8, wherein the peak detector output is zero when the PWM detector output is zero.

10. The system of claim 9, wherein the wake-by-control pilot circuit includes a rising edge detector operable to output the wake-up signal pulse upon a transition from zero to the lower-voltage DC signal at the peak detector output.

11. A wake-by-control pilot circuit for generating a wake-up signal pulse to a controller for an on-board battery charging system provided in a vehicle, the wake-by-control pilot circuit comprising:
    an input for receiving a control pilot signal;
    a pulse width modulation (PWM) detector that outputs signal pulses when the control pilot signal is pulse width modulated;
    a peak detector connected to an output side of the PWM detector, the peak detector operable to output a lower-voltage DC signal when the PWM detector outputs signal pulses; and
    an edge detector connected to an output side of the peak detector, the edge detector operable to output the wake-up signal pulse upon a transition from zero to the lower-voltage DC signal at the peak detector output.

12. The wake-by-control pilot circuit of claim 11, wherein the control pilot signal indicates a valid connection to an external power supply and a maximum current that can be drawn from an electrical power utility grid.

13. The wake-by-control pilot circuit of claim 11, wherein the wake-by-control pilot circuit generates the wake-up signal pulse when the control pilot signal transitions from zero to any active signal and when the control pilot signal transitions from a non-zero static DC voltage to an active PWM signal.

14. The wake-by-control pilot circuit of claim 11, wherein the PWM detector includes a logic gate having a first input for receiving the control pilot signal and a second input for receiving a delayed control pilot signal.

15. The wake-by-control pilot circuit of claim 14, wherein the logic gate is an exclusive-OR gate.

16. The wake-by-control pilot circuit of claim 14, further comprising a lower-voltage power source operable to power the PWM detector.

17. An apparatus comprising:
    an on-board battery charger connected to a high-voltage battery in a vehicle and operable to charge the high-voltage battery when connected to electric vehicle supply equipment (EVSE), the on-board battery charger including:
        a controller operable to detect a connection to the EVSE; and
        a wake-by-control pilot circuit connected to an input side of the controller, the wake-by-control pilot circuit having an input for receiving a control pilot signal from the EVSE and outputting a wake-up signal pulse to wake the controller from a sleep mode when the EVSE exits a delayed charge mode, the wake-by-control pilot circuit including a pulse width modulation (PWM) detector that outputs signal pulses when the control pilot signal is pulse width modulated.

18. The apparatus of claim 17, wherein the wake-by-control pilot circuit further comprises:
    a lower-voltage power source operable to power the PWM detector;
    a peak detector connected to an output side of the PWM detector, the peak detector operable to output a lower-voltage DC signal when the PWM detector outputs signal pulses; and
    an edge detector connected to an output side of the peak detector, the edge detector operable to output the wake-up signal pulse upon a transition from zero to the lower-voltage DC signal at the peak detector output.

19. The apparatus of claim 18, wherein the wake-by-control pilot circuit generates the wake-up signal pulse when the control pilot signal transitions from zero to any active signal and when the control pilot signal transitions from a non-zero static DC voltage to an active PWM signal.

* * * * *